United States Patent
Yoshimoto

(10) Patent No.: US 11,636,558 B2
(45) Date of Patent: Apr. 25, 2023

(54) ENERGY MANAGEMENT SYSTEM AND ENERGY MANAGEMENT METHOD FOR WATER SUPPLY

(71) Applicant: Hitachi, Ltd., Tokyo (JP)

(72) Inventor: Naoki Yoshimoto, Tokyo (JP)

(73) Assignee: Hitachi, Ltd., Tokyo (JP)

(*) Notice: Subject to any disclaimer, the term of this patent is extended or adjusted under 35 U.S.C. 154(b) by 128 days.

(21) Appl. No.: 17/123,302

(22) Filed: Dec. 16, 2020

(65) Prior Publication Data

US 2021/0233185 A1 Jul. 29, 2021

(30) Foreign Application Priority Data

Jan. 29, 2020 (JP) .............................. JP2020-012583

(51) Int. Cl.
*G06Q 50/06* (2012.01)
*G06Q 10/06* (2023.01)
(Continued)

(52) U.S. Cl.
CPC .............. *G06Q 50/06* (2013.01); *G01R 11/56* (2013.01); *G05B 13/026* (2013.01);
(Continued)

(58) Field of Classification Search
CPC ........... G06Q 10/063; G06Q 10/06315; G06Q 50/06; G01R 11/56; G05B 13/026;
(Continued)

(56) References Cited

U.S. PATENT DOCUMENTS 5,289,362 A * 2/1994 Liebl .................. G05D 23/1923
705/412
8,958,922 B2 * 2/2015 Blank .................... G05B 15/02
700/282
(Continued)

FOREIGN PATENT DOCUMENTS

CN 2015001008328 A * 12/2015 ............. G06Q 50/06
JP 2002-135977 A 5/2002
(Continued)

OTHER PUBLICATIONS

Machine translation of JP-2021057962-A.*
Machine translation of KR-20130070562-A.*
Machine translation of CN-2015001008328-A.*

*Primary Examiner* — M. N. Von Buhr
(74) *Attorney, Agent, or Firm* — Baker Botts L.L.P.

(57) ABSTRACT

Cooperation in supply and demand balance of renewable energy in a region is implemented by operation of infrastructures of an infrastructure service such as water supply. In an energy management system including: a processor; and a storage device, the processor predicts an electric power supply amount utilizing renewable energy in a predetermined region, predicts an electric power demand amount in the region, predicts a demand amount of an infrastructure service different from an electric power service in the region, predicts an electric power demand amount corresponding to the infrastructure service on the basis of the predicted demand amount of the infrastructure service in the region, and determines use time of electric power corresponding to the infrastructure service such that the electric power demand amount in the region approaches the electric power supply amount.

14 Claims, 9 Drawing Sheets

(51) Int. Cl.
*H02H 3/14* (2006.01)
*H02J 3/14* (2006.01)
*G06Q 10/063* (2023.01)
*G01R 11/56* (2006.01)
*G05B 13/02* (2006.01)
*G06Q 10/0631* (2023.01)

(52) U.S. Cl.
CPC ..... *G06Q 10/063* (2013.01); *G06Q 10/06315* (2013.01); *H02J 3/14* (2013.01); *H02J 2310/12* (2020.01)

(58) Field of Classification Search
CPC .... H02J 3/14; H02J 3/003; H02J 3/004; H02J 2310/12; H02J 2310/54; H02J 2300/20; Y02B 70/3225; Y04S 20/222
See application file for complete search history.

(56) References Cited

U.S. PATENT DOCUMENTS

| | | | | |
|---|---|---|---|---|
| 9,251,543 | B2* | 2/2016 | Sticht | G06Q 30/0202 |
| 9,715,261 | B2* | 7/2017 | Wilkins | H02J 3/14 |
| 9,824,409 | B2* | 11/2017 | Katayama | G06Q 10/00 |
| 2004/0054564 | A1* | 3/2004 | Fonseca | G06Q 10/06315 |
| | | | | 705/7.29 |
| 2007/0130093 | A1* | 6/2007 | Haji-Valizadeh | G06Q 50/06 |
| | | | | 705/413 |
| 2008/0167931 | A1* | 7/2008 | Gerstemeier | H02J 13/00022 |
| | | | | 705/7.22 |
| 2011/0238232 | A1* | 9/2011 | Tomita | H02J 7/35 |
| | | | | 700/297 |
| 2012/0010757 | A1* | 1/2012 | Francino | G05B 15/02 |
| | | | | 700/291 |
| 2012/0232706 | A1* | 9/2012 | Hayashida | H02J 3/14 |
| | | | | 700/282 |
| 2012/0323380 | A1 | 12/2012 | Kobayashi et al. | |
| 2014/0163754 | A1* | 6/2014 | Potter | H02J 3/28 |
| | | | | 700/287 |
| 2014/0163755 | A1* | 6/2014 | Potter | H02J 3/381 |
| | | | | 700/287 |
| 2014/0222237 | A1* | 8/2014 | Hibiya | H02J 7/35 |
| | | | | 700/295 |
| 2014/0257584 | A1* | 9/2014 | Tanimoto | G06Q 10/06 |
| | | | | 700/291 |
| 2014/0330442 | A1* | 11/2014 | Obara | G05B 13/02 |
| | | | | 700/291 |
| 2015/0278405 | A1* | 10/2015 | Andersen | F03D 17/00 |
| | | | | 703/18 |
| 2017/0159270 | A1* | 6/2017 | Garg | G06Q 50/06 |
| 2019/0362445 | A1* | 11/2019 | Farrokhabadi | H02J 13/0013 |

FOREIGN PATENT DOCUMENTS

| | | | |
|---|---|---|---|
| JP | 2013-002091 A | | 1/2013 |
| JP | 2021057962 A | * | 4/2021 ............. H02J 13/00 |
| KR | 20130070562 A | * | 6/2013 ........... G01F 15/065 |

* cited by examiner

FIG. 4

| | DATA TYPE | DATA NAME | FORM | USAGE |
|---|---|---|---|---|
| 1 | METEOROLOGICAL DATA | TEMPERATURE | 10-MINUTE DATA (ACTUAL PAST VALUE) | DEMAND PREDICTION |
| 2 | | SUNLIGHT | 10-MINUTE DATA (ACTUAL PAST VALUE) | DEMAND PREDICTION |
| 3 | | HUMIDITY | 10-MINUTE DATA (ACTUAL PAST VALUE) | DEMAND PREDICTION |
| 4 | | 24-HOUR TEMPERATURE PREDICTION | 24 HOURS EVERY HOUR | DEMAND PREDICTION |
| 5 | | 24-HOUR SUNLIGHT PREDICTION | 24 HOURS EVERY HOUR | DEMAND PREDICTION |
| 6 | | 24-HOUR HUMIDITY PREDICTION | 24 HOURS EVERY HOUR | DEMAND PREDICTION |
| 7 | ELECTRIC POWER DEMAND | HOME ELECTRIC POWER DEMAND PERFORMANCE | 10-MINUTE INTEGRATION DATA (ACTUAL PAST VALUE) | DEMAND PREDICTION |
| 8 | | COMMERCIAL ELECTRIC POWER DEMAND PERFORMANCE | 10-MINUTE INTEGRATION DATA (ACTUAL PAST VALUE) | DEMAND PREDICTION |
| 9 | | WATER SUPPLY EQUIPMENT ELECTRIC POWER DEMAND PERFORMANCE | 10-MINUTE INTEGRATION DATA (ACTUAL PAST VALUE) | DEMAND PREDICTION |
| 10 | OPERATION CALENDAR | COMMERCIAL DEPARTMENT AIR CONDITIONING CALENDAR | ONE-HOUR DATA | DEMAND PREDICTION |
| 11 | HEAT STORAGE/ HEAT DEMAND | HOME WATER HEATER HOT WATER STORAGE CALENDAR | ONE-HOUR DATA | DEMAND PREDICTION |
| 12 | | COMMERCIAL WATER HEATER HOT WATER STORAGE CALENDAR | ONE-HOUR DATA | DEMAND PREDICTION |
| 13 | WATER SUPPLY EQUIPMENT DEMAND | WATER SUPPLY EQUIPMENT OPERATION PERFORMANCE | 10-MINUTE DATA (ACTUAL PAST VALUE) | DEMAND PREDICTION |
| 14 | RENEWABLE ENERGY | SOLAR POWER GENERATION PERFORMANCE | ONE-MINUTE DATA (ACTUAL PAST VALUE) | DEMAND PREDICTION |
| 15 | | WIND-POWER GENERATION PERFORMANCE | ONE-MINUTE DATA (ACTUAL PAST VALUE) | DEMAND PREDICTION |
| 16 | WATER SUPPLY DEMAND | HOME WATER SUPPLY DEMAND PERFORMANCE | ONE-MINUTE DATA (ACTUAL PAST VALUE) | DEMAND PREDICTION |
| 17 | | COMMERCIAL WATER SUPPLY DEMAND PERFORMANCE | ONE-MINUTE DATA (ACTUAL PAST VALUE) | DEMAND PREDICTION |

ENERGY MANAGEMENT SYSTEM AND ENERGY MANAGEMENT METHOD FOR WATER SUPPLY

CLAIM OF PRIORITY

The present application claims priority from Japanese patent application JP 2020-12583 filed on Jan. 29, 2020, the content of which is hereby incorporated by reference into this application.

BACKGROUND OF THE INVENTION

1. Field of the Invention

The present invention relates to a technology for optimizing energy supply and demand in a region in which introduction of variable renewable energy is expanded.

2. Description of the Related Art

In recent years, spread and expansion of renewable energy for the purpose of reduction of greenhouse effect gas has been continued. It is pointed out that, among variable renewable energy (VRE), specifically, VRE supplied by wind-power generation or solar power generation is required, due to fluctuation of energy supply, to be adjusted in its supply and demand balance in the style that does not rely upon fossil fuel unlike conventional thermal power generation.

Further, in order to adjust the supply and demand balance of the variable renewable energy, not only concentrated type variable power supply such as conventional thermal power generation but also adjustment by electric power cooperation between consumers are indispensable. Specifically, in the solar power generation, achievement of the balance between supply and demand in a specific region enables procurement of less expensive electric power in the specific region, and is further useful for maintenance and management of local power distribution.

As an attempt for minimizing the electric power consumption by infrastructure operation in a region, an example is available in which data of water supply demand is read and operation of water purification facilities or water distribution pumps is made cooperate with one another on the basis of the data to minimize the electric power consumption amount (JP-2013-2091-A).

Further, in order to adjust the supply and demand balance of electric power, in addition to electric power demand, a technology of predicting supply of variable renewable energy (VRE) is examined (Patent Document 2), and contribution to improvement of demand prediction accuracy by utilizing a plan based on a schedule of electric power demand or utilizing weather forecasting, and to improvement of prediction accuracy of the supply and demand balance of electric power by adopting combination with the technology of predicting supply of VRE is examined.

In this manner, while coordination between VRE and electric power demand in a region is important for stable supply of electric power in the region, for electric power coordination, it is necessary to cope with the scale and the time such as the scale of electric power and absorption and emission of the electric power amount over several hours. However, in the conventional systems, it has been insufficient to cope with both the scale and the time.

Further, although introduction of a water supply smart meter and the like that acquire water supply demand at a fixed interval of time is examined, data of the smart meter is used mainly for control of water supply facilities, and an example of electric power coordination operation of water supply facilities has begun to appear. The electric power coordination operation of water supply facilities mainly copes with large-scale water supply facilities, namely, with the scale of electric power and cannot cope with time.

In this manner, there have been problems that cooperation between an electric power system and electric power demand in a region requires coping with both the electric power scale and the time, and it is necessary to cover electric power in a good balance in a region.

SUMMARY OF THE INVENTION

In order to attain at least one of the problems described above, according to the present invention, there is provided an energy management system including a processor and a storage device. In the energy management system, the processor predicts an electric power supply amount utilizing renewable energy in a predetermined region, predicts an electric power demand amount in the region, predicts a demand amount of an infrastructure service different from an electric power service in the region, predicts an electric power demand amount corresponding to the infrastructure service on the basis of the predicted demand amount of the infrastructure service in the region, and determines use time of electric power corresponding to the infrastructure service such that the electric power demand amount in the region approaches the electric power supply amount.

According to the present invention, cooperation in demand and supply balance of variable renewable energy in a region can be implemented by operation of infrastructures of the infrastructure service.

Problems, configurations, and advantageous effects other than those described above are made clear by the following description of the embodiment.

BRIEF DESCRIPTION OF THE DRAWINGS

FIG. 4 is an explanatory view of information retained by the regional energy management apparatus according to the embodiment of the present invention;

DESCRIPTION OF THE PREFERRED EMBODIMENTS

In the following, a mode for carrying out the present invention is described. The following embodiment is an example, and the present invention is not at all restricted by the present embodiment.

(Configuration of System)

Figure 1:
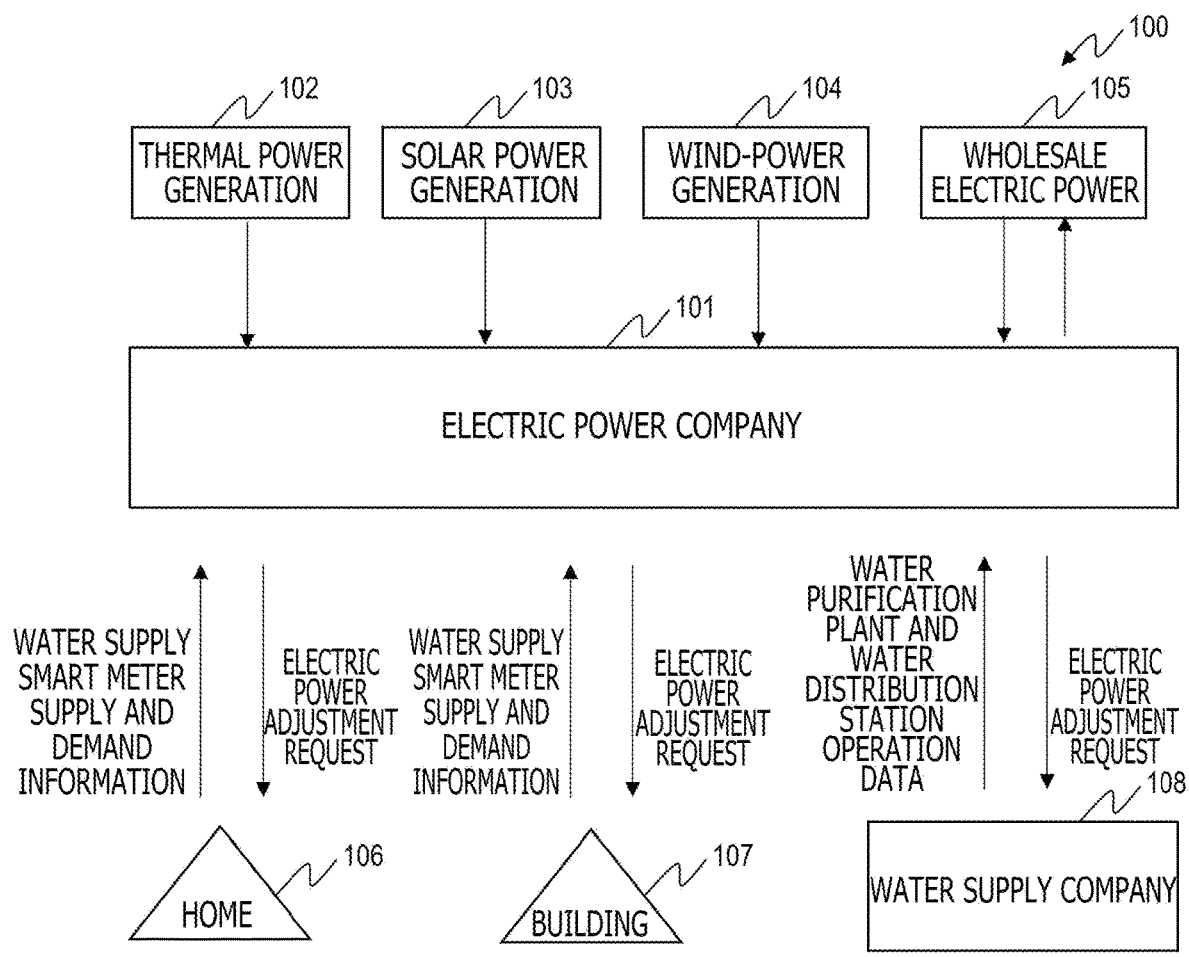
FIG. 1 is a block diagram depicting an overall configuration of a regional energy management system according to an embodiment of the present invention.

FIG. 1 is a block diagram depicting an overall configuration of a regional infrastructure cooperation electric power demand management system (hereinafter referred to sometimes as regional energy management system) according to the embodiment of the present invention.

The regional energy management system 100 of the present embodiment is configured from various power generation companies and so forth, an electric power company 101, and various consumers. In FIG. 1, a thermal power generation company 102, a solar power generation company 103, and a wind-power generation company 104 are indicated as the power generation companies. The electric power company 101 supplies electric power generated by the power generation companies to the consumers. The electric power company 101 has a function of managing the demand as hereinafter described.

The solar power generation company 103 and the wind-power generation company 104 are examples of suppliers of variable renewable energy (VRE), and another power generation company of VRE may be included in the system. Further, it is also possible for the electric power company 101 to buy electric power from a wholesale electric power company 105 and sell surplus electric power to the wholesale electric power company 105. Although, in the example of FIG. 1, the electric power company 101, various power generation companies, and wholesale electric power company 105 are indicated individually as different companies, at least some of the companies may be the same company.

In FIG. 1, a home 106, a building 107, and a water supply company 108 are depicted as consumers. The home 106 is a consumer consuming electric power for illumination, air conditioning, cooking, hot water supply, and so forth used by a resident for the life. The building 107 containing commercial facilities, offices, and so forth as its tenants is a consumer consuming electric power mainly for business purpose. The water supply company 108 is a consumer consuming electric power by performing water purification and so forth and supplying water supply to the home 106 and the building 107.

Although, in FIG. 1, one home 106, one building 107, and one water supply company 108 are depicted as examples, generally a great number of families 106, a great number of buildings 107, and one or a plurality of water supply companies 108 may exist in the regional energy management system 100. Further, the home 106, building 107, and water supply company 108 are not only consumers of electric power as described above but also consumers of water supplied by the water supply company 108.

The electric power company 101 of the present embodiment acquires demand information of water supply from the home 106 and the building 107. For example, the electric power company 101 may acquire information from a water supply smart meter provided in each the home 106 and the building 107. On the other hand, the electric power company 101 acquires operation data and so forth of a water purification plant and a water distribution station from the water supply company 108. Further, the electric power company 101 may acquire electric power demand information (for example, information from the electric power smart meter) from the consumers. Then, the electric power company 101 outputs an electric power adjustment request to each of the consumers.

Figure 2:
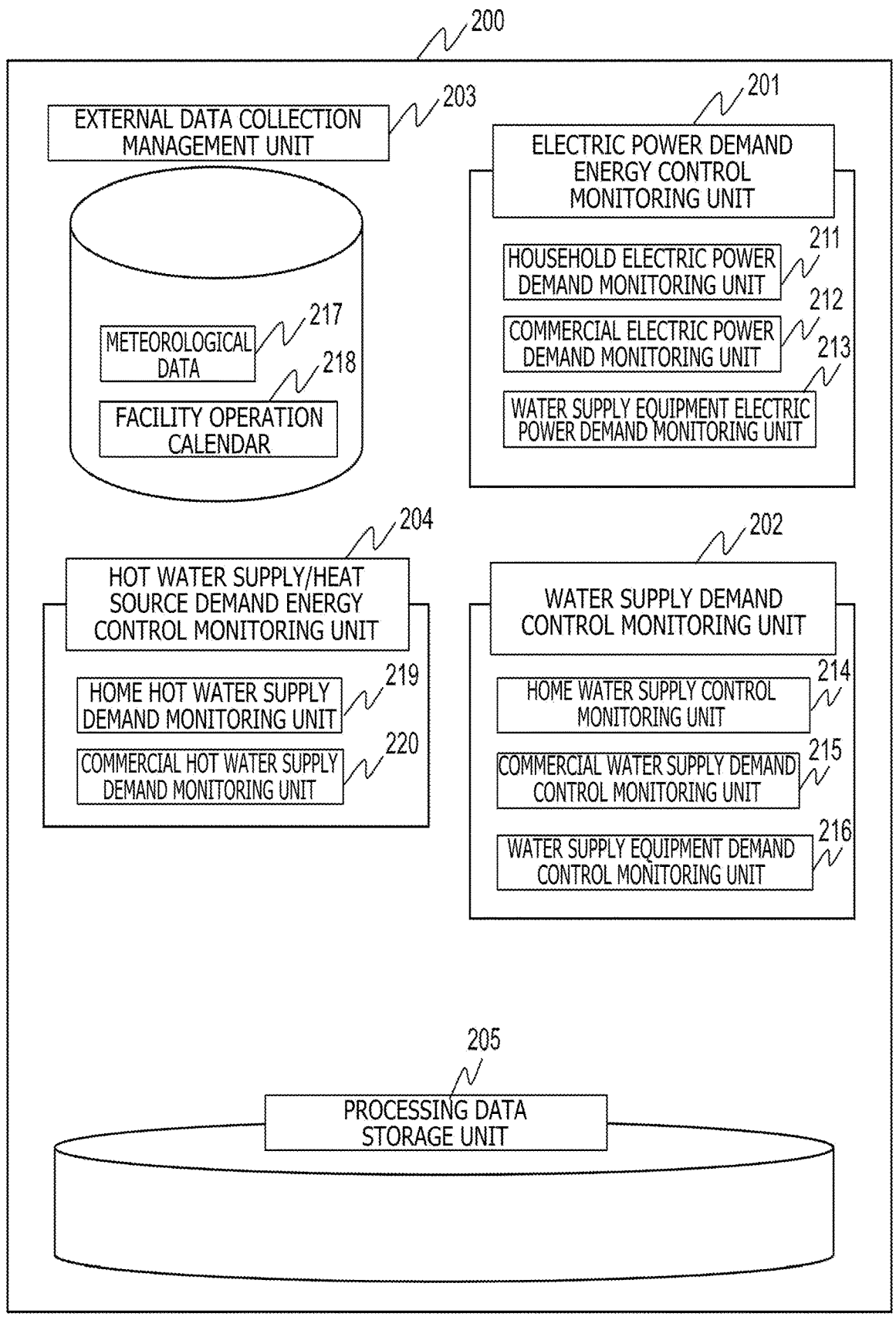
FIG. 2 is a block diagram depicting a configuration of a regional energy management apparatus configuring the regional energy management system according to the embodiment of the present invention.

FIG. 2 is a block diagram depicting a configuration of a regional energy management apparatus 200 configuring the regional energy management system 100 according to the embodiment of the present invention.

The regional energy management apparatus 200 includes an electric power demand energy demand monitoring unit 201, a water supply demand control monitoring unit 202, an external data collection management unit 203, hot water supply/heat source demand energy control monitoring unit 204, and a processing data storage unit 205.

The electric power demand energy demand monitoring unit 201 monitors electric power demand from the consumers. The electric power demand energy demand monitoring unit 201 depicted in FIG. 2 includes a household electric power demand monitoring unit 211 that monitors electric power demand from the home 106, a commercial electric power demand monitoring unit 212 that monitors electric power demand for business use of the building 107 or the like, and a water supply equipment electric power demand monitoring unit 213 that monitors electric power demand from the water supply company 108.

The water supply demand control monitoring unit 202 performs controlling and monitoring of water supply demand. The water supply demand control monitoring unit 202 depicted in FIG. 2 includes a home water supply control monitoring unit 214 that performs controlling and monitoring of water supply demand in the home 106, a commercial water supply demand control monitoring unit 215 that performs controlling and monitoring of water supply demand for business use of the building 107 or the like, and a water supply equipment demand control monitoring unit 216 that performs controlling and monitoring of water supply demand in equipment of the water supply company 108.

The external data collection management unit 203 collects and stores external data into the regional energy management apparatus 200. The external data to be collected includes, for example, meteorological data 217, facility operation calendar 218, and so forth. The meteorological data 217 may include data about a weather, an outdoor temperature, a humidity, and so forth of a region that is a management target of the regional energy management system 100. Further, the facility operation calendar 218 is a schedule of events of the consumer.

For example, the facility operation calendar 218 may include, in regard to the building 107, information about a working date, working time, and a date on which a special event is performed and so forth of an office resident in the building 107 or may include information about a working date, a sales day, and so forth of a commercial facility resident in the building 107. Further, in regard to the home 106, the facility operation calendar 218 may include information about an expected date of stay, an action schedule during stay, and so forth of a resident. Further, in regard to the water supply company 108, the facility operation calendar 218 may include information about an operation schedule and so forth of the equipment of the water supply company 108.

The hot water supply/heat source demand energy control monitoring unit 204 performs mainly controlling and monitoring of demand of a heat source for a hot water supply in the consumers. The hot water supply/heat source demand energy control monitoring unit 204 depicted in FIG. 2 includes a home hot water supply demand monitoring unit 219 that performs monitoring of hot water supply demand by the home 106 and a commercial hot water supply demand monitoring unit 220 that performs monitoring of hot water supply demand for business use in the building 107 or the like.

In the processing data storage unit 205, data used for processing by the regional energy management apparatus 200, data obtained as a result of the processing, and so forth are stored.

Figure 3:
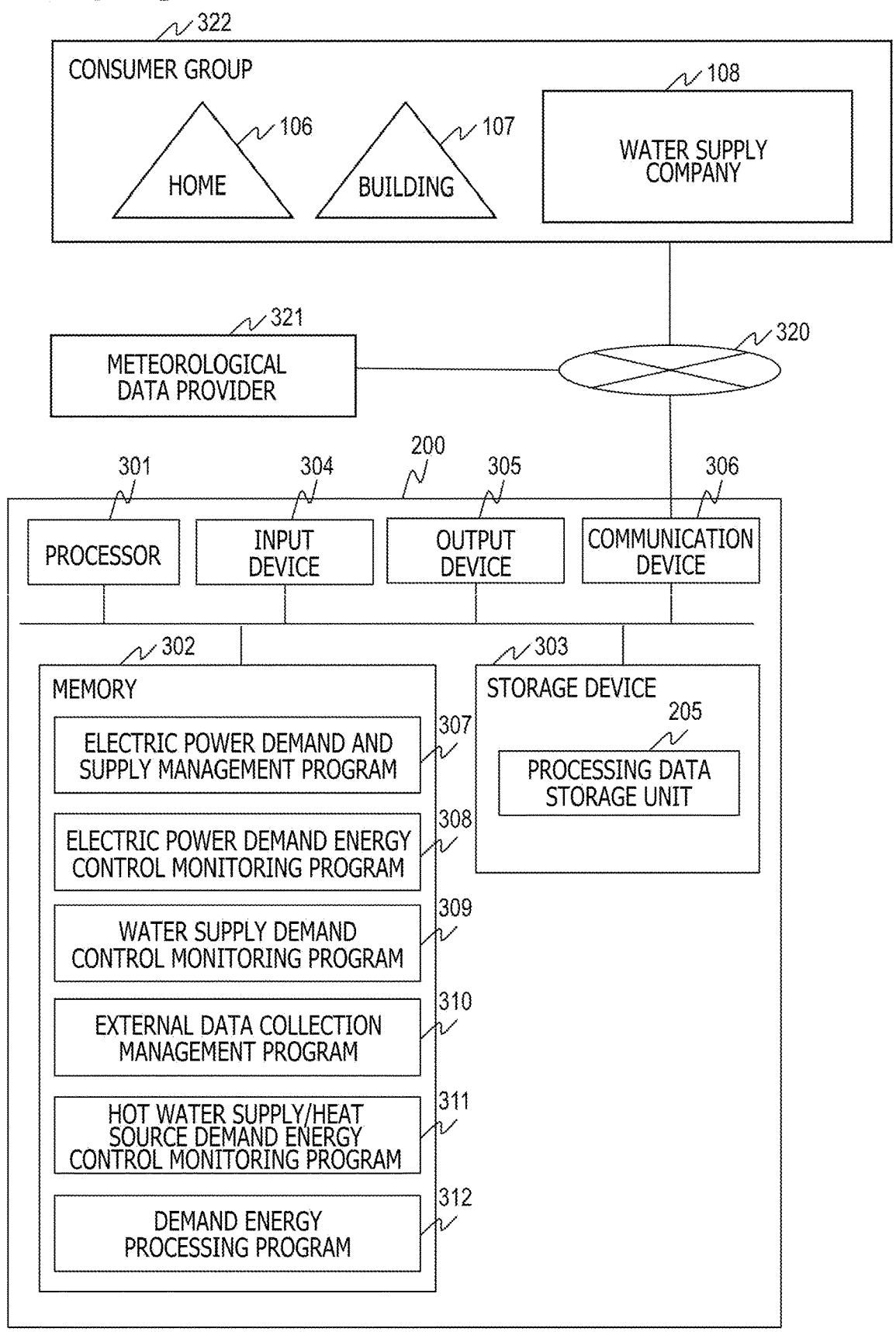
FIG. 3 is a block diagram of a hardware configuration of the regional energy management apparatus according to the embodiment of the present invention.

FIG. 3 is a block diagram of a hardware configuration of the regional energy management apparatus 200 according to the embodiment of the present invention.

The regional energy management apparatus 200 of the present embodiment includes a processor 301, a memory 302, a storage device 303, an input device 304, an output device 305 and a communication device 306.

The processor 301 controls the regional energy management apparatus 200 according to a program stored in the memory 302.

The memory 302 is, for example, a semiconductor memory and stores therein a program executed by the processor 301, data referred to by the processor 301, data acquired as a result of the processing executed by the processor 301, and so forth. At least part of the program and data stored in the storage device 303 may be copied to the memory 302 as required, or the acquired data may be copied from the memory 302 to the storage device 303 as required.

In the example of FIG. 3, an electric power demand and supply management program 307, an electric power demand energy control monitoring program 308, a water supply demand control monitoring program 309, an external data collection management program 310, a hot water supply/heat source demand energy control monitoring program 311, and a demand energy processing program 312 are stored in the memory 302. They are programs for implementing processes executed by the electric power demand energy demand monitoring unit 201, water supply demand control monitoring unit 202, external data collection management unit 203, and hot water supply/heat source demand energy control monitoring unit 204 depicted in FIG. 2. The processes executed by the components described above in the present embodiment are executed actually by the processor 301 according to commands described in the above programs.

The storage device 303 includes a nonvolatile storage medium such as a flash memory or a hard disk drive. The processing data storage unit 205 depicted in FIG. 2 corresponds to a storage region of the storage device 303.

The input device 304 accepts an input from the user of the regional energy management apparatus 200. Specifically, the input device 304 may include, for example, a keyboard, a button, a pointing device, or the like. For example, at least part of information stored into the storage device 303 may be input through the input device 304.

The output device 305 outputs information to the user of the regional energy management apparatus 200. Specifically, the output device 305 may include, for example, an image display device or the like.

The communication device 306 is a device for allowing data communication between the regional energy management apparatus 200 and an external apparatus (for example, a meteorology data provider 321, a consumer group 322, and so forth hereinafter described) through a wired or wireless network 320, and may include, for example, a local area network (LAN) adapter or the like. For example, at least part of information stored into the storage device 303 may be input through the communication device 306, and at least part of information generated as a result of processing according to the program described hereinabove may be output through the communication device 306.

To the network 320, the meteorology data provider 321 and the consumer group 322 are coupled. The meteorology data provider 321 is a provider of the meteorology data 217, and may be, for example, a public or private meteorology information service company or the like. The consumer group 322 includes, for example, the home 106, building 107, water supply company 108, and so forth. Information about a water supply smart meter or the like from consumers and an electric power adjustment request or the like from the regional energy management apparatus 200 is transmitted through the network 320.

FIG. 4 is an explanatory view of information retained by the regional energy management apparatus 200 according to the embodiment of the present invention.

FIG. 4 collectively depicts information retained by the regional energy management apparatus 200, and the information includes information retained as the meteorological data 217 or the facility operation calendar 218 and information retained by the processing data storage unit 205.

In FIG. 4, a type, a name, a form, a usage, and so forth of data retained by the regional energy management apparatus 200. As the type of the data, meteorological data, electric power demand, operation calendar, heat-storage heat-demand, water supply equipment demand, renewable energy, water supply demand, and so forth are available.

As data whose data type is "weather data," actual measurement values in the past, for example, of the air temperature, sunlight, humidity, and so forth are retained. They are data obtained at a predetermined interval of time such as every 10 minutes. Further, the meteorological data may include prediction values of the air temperature, sunlight, humidity, and so forth. They may be data or the like obtained every one hour period of time from the present point of time till 24 hours later, for example. The actual measurement values and the prediction values of the meteorological data described above are provided from the meteorological data provider 321, for example.

As data whose data type is "electric power demand," a home electric power demand performance, a commercial electric power demand performance, and a water supply equipment electric power demand performance are retained. They are accumulation data, for example, for every 10 minutes and may be generated on the basis of data sent from the electric power smart meters of the individual consumers.

Data whose data type is "electric power demand" may include, for example, an operation calendar and so forth of air conditioning equipment of a commercial department residing in the building 107. This may include information about control of air conditioning (ON/OFF, temperature setting and so forth), for example, for every one hour.

Data whose data type is "heat-storage heat-demand" may include a home water heater hot water storage calendar relating to a schedule for boiling and storing hot water by a water heater at a home and a commercial water heater hot water storage calendar relating to a schedule for boiling and storing hot water by a water heater at the commercial department. They may be predictions based on performance values or may be data input as schedules.

Data whose data type is "water supply equipment demand" includes an operation performance of water supply equipment, for example. This may include performance values in the past after every 10 minutes, for example.

Data whose data type is "renewable energy" includes an electric power generation performance by renewable energy from among the electric power generation performance by an electric power generation company. For example, this data may include an electric power generation performance by the solar power generation company 103 and an electric power generation performance by the wind-power generation company 104. They may each include a performance value in the past for each one minute, for example.

Data whose data type is "water supply demand" includes a performance of demand from the water consumers. For example, this data may include a water supply demand performance in the home 106 and a water supply demand performance for business use in the building 107. They may each include a performance value in the past for each one minute, for example.

In the present embodiment, demand prediction based on the data described above is performed as hereinafter described.

Now, an overview of processing by the regional energy management apparatus 200 of the present embodiment is described.

(Electric Power Generation Status and Electric Power Generation Amount Prediction of Variable Renewable Energy)

The electric power generation status of VRE is transmitted to the regional energy management apparatus 200. The regional energy management apparatus 200 can predict the electric power generation amount for next 24 hours to 48 hours on the basis of meteorological information and the electric power generation performance in the past. As the technology relating to electric power generation prediction of VRE, various known methods are available including a method in which prediction is performed based on meteorological information or a method improved in accuracy by comparison with the electric power generation performance in the past, and there is no specific restriction.

When the electric power generation amount of VRE is insufficient for the demand, the electric power company 101 receives supply of electric power from system electric power and supplies it to the consumers. Although the representation of system electric power is used here, this is a variable distributed electric power supply such as the thermal power generation or the cogeneration, and the function is the same if it is independent of the system. In the example of FIG. 1, electric power from the thermal power company 102 or the wholesale electric power company 105 corresponds to the system electric power.

(Description of Water Supply Infrastructure)

The water supply infrastructure managed by the water supply company 108 in the present embodiment signifies a large-scale facility such as a water purification facility or a water distribution pump. In a water purification facility or a water distribution pump facility, an individual control system for each facility is incorporated. Such facilities are operated based on the water supply demand, and the demand information is provided from the water supply smart meter of each consumer.

Although, in the present embodiment, a water purification facility and a water distribution pump are taken as examples of the water supply infrastructure, the water supply infrastructure may otherwise be a terminal treatment facility and is not specifically restrictive. Many of such water supply infrastructures perform operation based on the operation performance in the past, and if the water supply demand information is applied, then finer-tuned facility operation can be achieved.

(Water Supply Data of Consumer)

The water supply demand from a consumer is grasped by installing a water supply smart meter in each consumer. The water supply smart meter can grasp water supply demand for every time, and in the present invention, the water supply smart meter is utilized to grasp not only the water supply demand but also the hot water storage amount of hot water supply that is used for bathing, cooking, and so forth.

(Description of Power Coordination Control System)

Operation of a regional energy management system is described. The regional energy management system is a system that grasps a significant deviation in the supply and demand balance of electric power on the basis of prediction of electric power supply, performs operation of water supply infrastructures focusing on a time of surplus of electric power generation amount, and carries out a peak shift in which hot water supply demand performed in the night is shifted to be performed in the daytime.

According to the present embodiment, the prediction of electric power supply up to 48 hours later is calculated on the basis of meteorological information and electric power generation performances in the past. As the calculation method, electric power generation prediction methods for various VRE based on meteorological information have been proposed, and it is sufficient if a method optimum for the region is selected, and this is not specifically restrictive.

Then, the prediction of the electric power demand until 48 hours later is carried out in comparison with the demand performances in the past on the basis of the electric power demand, water supply demand, and meteorological information for 24 hours in the past. Grasping of the electric power demand can be carried out by data collection utilizing the smart meter or the like of each consumer. The demand of the water supply infrastructures can be grasped by the operation performance of each infrastructure facility. Since such electric power demands vary significantly depending upon the meteorological situation, the closest demand in comparison with the demand performances in the past is calculated as prediction data from the collected demand data and meteorological information.

Cooperation between the electric power supply and the demand is performed such that, after allocation to the scale and to the time is carried out, operation of the scale is allocated to the water supply infrastructure and operation of the time is allocated to energy storage by hot water supply to each consumer. The configuration for allocation to the scale and to the time may be similar to that in an existing electric power supply and demand system, and there is no specific restriction.

In the case where the demand for a short period of time is shifted, operation of the water supply infrastructure is adjusted. First, a shift of the operation time of a distribution pump, during which potential energy can be utilized, is examined, and when the electric power amount is not yet sufficient, operation of a water purification facility or the like is examined.

Since the water purification facility is operated based on the demand for water supply, the demand for water supply may not necessarily coincide with the cooperation timing of the electric power supply and demand balance. In this case, the demand for water supply is prioritized while the electric power cooperation is not selected for utilization.

Now, demand adjustment over time is described. The demand adjustment based on time is performed through the following four steps.
(1) Grasping of the water supply demand by the water supply smart meters
(2) Calculation of hot water supply energy in comparison with the water supply demand in the past
(3) Calculation of a time zone within which hot water supply is carried out
(4) Instruction to carry out hot water boiling The water supply smart meter can grasp the water supply demand every time. Although the water supply demand includes demand by cooking, toilet, hot water supply, and so forth, it is necessary to grasp the heat demand by hot water supply from among the demand. The demand relating to hot water supply is mainly occupied by the demand relates to cooking and bathing and occupies roughly, as a standard, 50 to 70 percent of the demand from which the demand by toilet is excluded. Since the demand by toilet can be estimated readily from data of the smart meter because the demand per time is a fixed amount by which the water flows out from a toilet tank, and accordingly, the hot water supply demand is estimated in the form of deducting the water amount by toilet.

In verification of the hot water supply demand, the accuracy in calculation of the hot water supply demand can be increased by comparing the water supply demand in the past corresponding to the meteorological situation of the same date and the day of the week (schedule) with the hot water supply demand.

Then, within a time zone within which surplus electric power supply occurs, the regional total amount of stored energy of boiling hot water supply is calculated. On the basis of this demand, an instruction on actual boiling is issued to the hot water supply facility of each consumer.

By the operation described above, cooperative operation between the electric power supply and the demand relating to the water supply infrastructure is possible.

Now, a specific example of processing of the regional energy management apparatus 200 of the present embodiment is described with reference to a flow chart.

Figure 5:
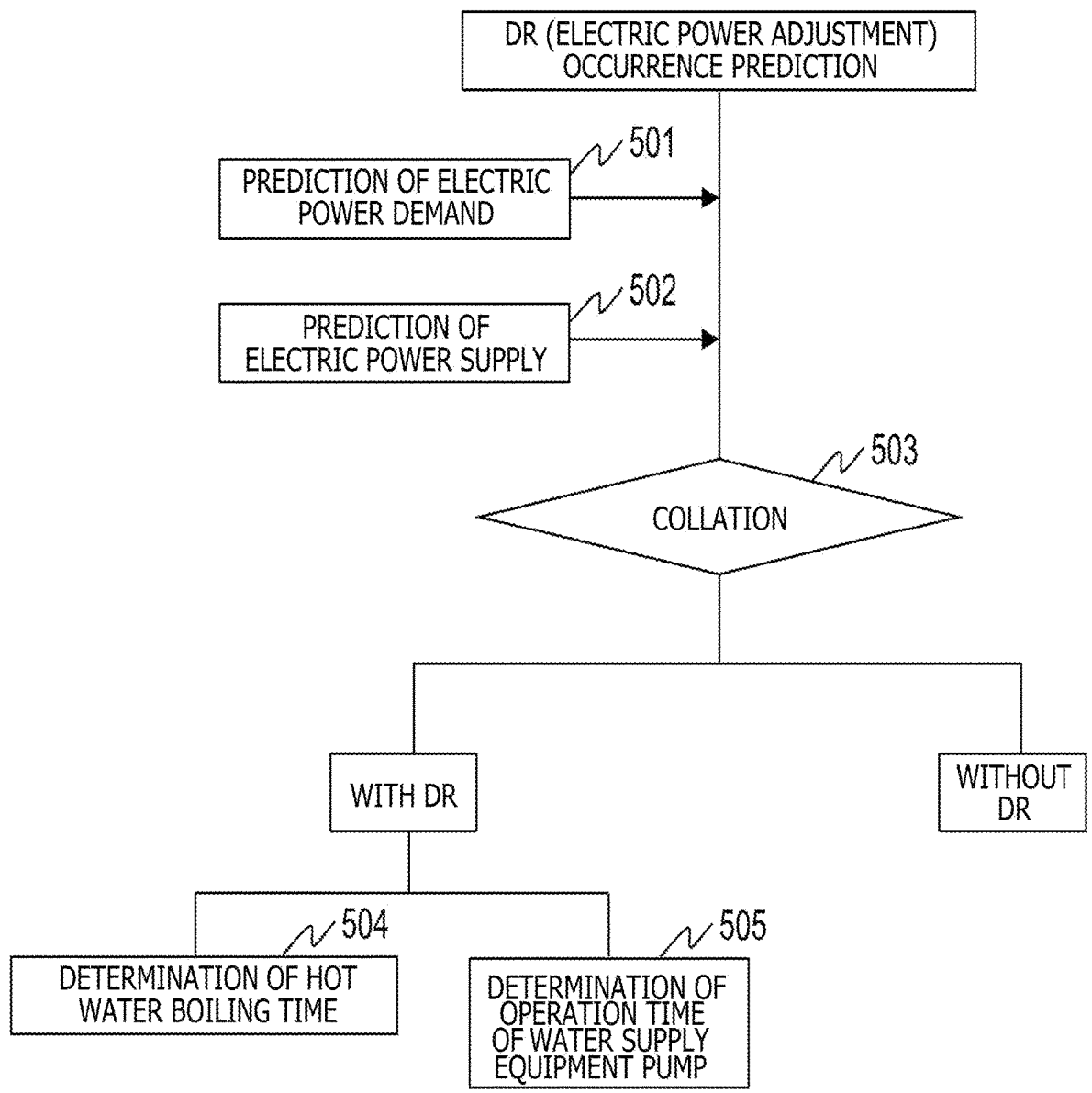
FIG. 5 is a flow chart of an electric power adjustment occurrence prediction process executed by the regional energy management apparatus according to the embodiment of the present invention.

FIG. 5 is a flow chart of an electric power adjustment occurrence prediction process executed by the regional energy management apparatus 200 according to the embodiment of the present invention.

After the regional energy management apparatus 200 starts processing of electric power adjustment (hereinafter referred to also as DEMAND RESPONSE (DR)) occurrence prediction, it performs prediction of the electric power demand (step 501) and prediction of the electric power supply (step 502), and collates these results of the predictions to decide whether electric power adjustment is performed and, when the electric power adjustment is performed, the regional energy management apparatus 200 decides what electric power adjustment is performed (step 503). Details of the prediction of electric power adjustment (step 501) and the prediction of the electric power supply (step 502) are hereinafter described with reference to FIGS. 6 and 7, respectively.

When the regional energy management apparatus 200 decides in step S503 that electric power adjustment is not performed, the processing is ended without performing electric power adjustment. In contrast, when the regional energy management apparatus 200 decides in step 503 that electric power adjustment is performed, it further decides a type of the electric power adjustment. Specifically, the regional energy management apparatus 200 decides which one of the electric power adjustment by adjustment of the hot water supply boiling time and the electric power adjustment by adjustment of the water supply equipment pump operation time is performed. In the present embodiment, the former adjustment is performed mainly in order to cope with surplus electric power supply over a long period of time while the latter adjustment is performed mainly for adjustment (peak shift) for surplus in a short cycle. Here, several examples of the decision in step 503 are described.

As a first example, a case is described in which, although the weather in the daytime is generally good and electric power supply by solar power generation is plentiful, the demand peak in the evening is great and the drop in solar power generation and the electric power demand peak mismatch. In this case, it is necessary to use a great peak shift. In other words, since a great demand peak shift is necessary although it is short in time, decision is performed such that electric power adjustment utilizing water supply equipment, which allows large equipment control, is performed.

As a second example, a case is described in which, although a peak does not appear, it is desired to cope with electric power demand over a long period of time not only in the daytime but also at night, such as air conditioning demand in a steaming season in summer or a severe season in winter. In this case, heat storage by hot water supply is applied to assure warming demand in the daytime or a heat storage tank in a large scale building is utilized to achieve daytime procurement for night energy. As a guide, a case is supposed in which the electric power consumption difference between night and daytime is very small or the night electric power consumption is greater than the daytime electric power consumption.

A criterion in this case may be such that, for example, when an increase in electric power demand to the extent of reaching a peak position of the demand is appeared during two hours before the sunset during which a sudden drop (dark curve) of solar power generation occurs, the demand peak itself is shifted to the daytime in which solar power generation is greater.

As a third example, a case is described in which significant oversupply occurs. For example, when the weather is warm and the industrial demand decreases significantly in large holidays in May or the like, oversupply of electric power is expected. In this case, both a mode for a short period demand peak and a mode for long term demand are activated to use operation in a mode in which the electric power in the daytime is positively utilized. Although charge by time is not applied currently, since the wholesale electric power price approaches zero yen in a significant oversupply state in the future, also an economical merit can be expected for the consumer side.

Now, such electric power adjustments are described individually. When the regional energy management apparatus 200 decides in step 503 that adjustment for long time surplus is performed, it executes processing of hot water supply boiling time determination (step 504). Details of this processing are hereinafter described with reference to FIG. 8. On the other hand, when the regional energy management apparatus 200 decides in step 503 that adjustment (peak shift) against the fluctuation of the short time period is performed, it executes a process of water supply equipment pump operation time determination (step 505). Details of this process are hereinafter described with reference to FIG. 9.

Figure 6:
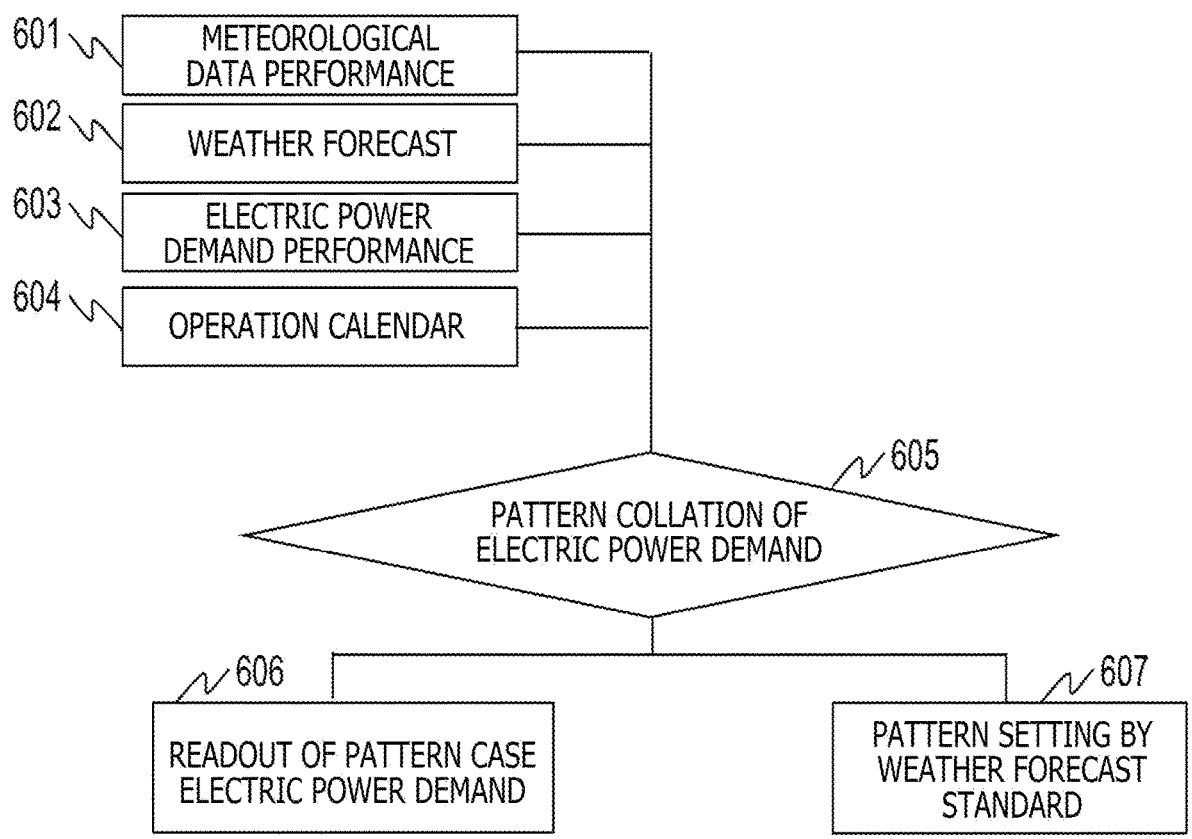
FIG. 6 is a flow chart of a prediction process of electric power demand executed by the regional energy management apparatus according to the embodiment of the present invention.

FIG. 6 is a flow chart of a prediction process of electric power demand executed by the regional energy management apparatus 200 according to the embodiment of the present invention.

The regional energy management apparatus 200 acquires a meteorological data performance 601, a weather forecast 602, an electric power demand performance 603, and an operation calendar 604 and performs pattern collation of the electric power demand based on those (step 605)

The meteorological data performance 601 is data indicative of a performance of the climate in the past, and the weather forecast 602 is data indicative of a prediction about weather in the future. Those data may be acquired from meteorological data 217. The electric power demand performance 603 is data indicative of a performance of electric power demand in the past in a region of a management target by the regional energy management apparatus 200. The operation calendar 604 is information indicative of an operation schedule of facilities and so forth in the region of the management target by the regional energy management apparatus 200 and may include both the performance in the past and a schedule in the future. The operation calendar 604 may be acquired from the facility operation calendar 218.

In step 605, the regional energy management apparatus 200 collates the weather forecast 602 and the operation calendar 604 in the future (during a predetermined period till 36 hours later or 48 hours later from the present point of time) with the meteorological data performance 601 and the operation calendar 604 in the past, and when a similar combination is found, the regional energy management apparatus 200 may read out the electric power demand performance 603 within the period and retain the electric power demand performance 603 as a prediction result of the electric power demand in the future (step 606).

On the other hand, in the case where a similar combination is not found, the regional energy management apparatus 200 may set a new pattern of electric power demand in the future on the basis of the weather forecast 602 (step 607).

Figure 7:
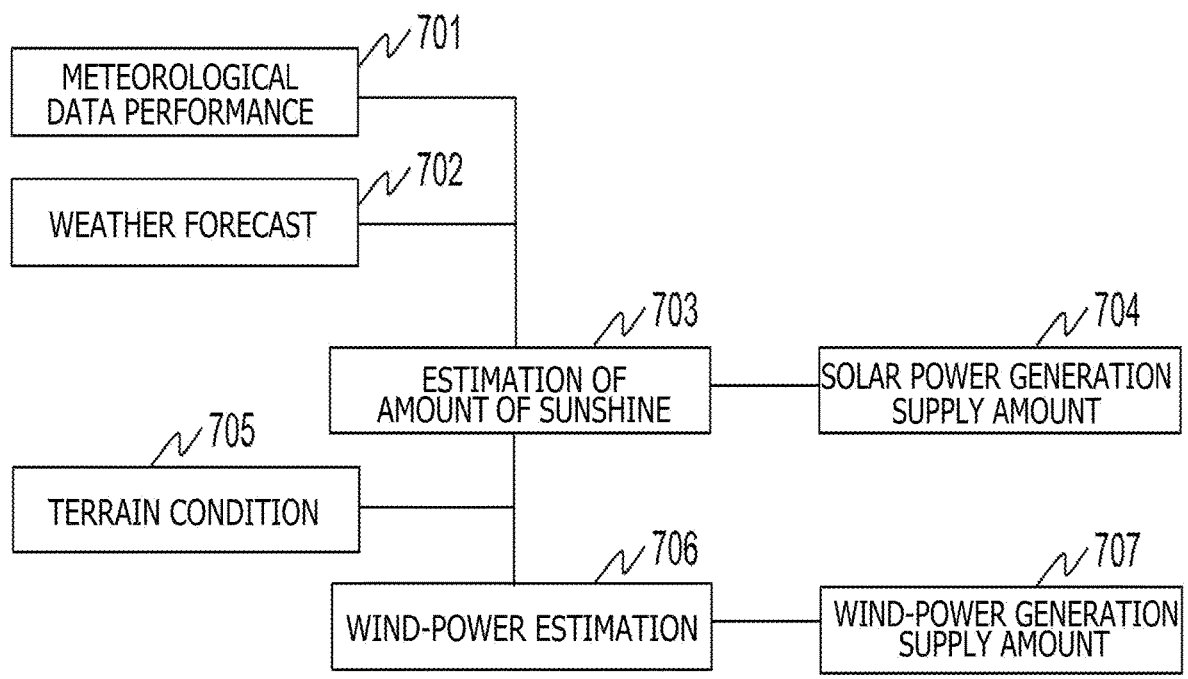
FIG. 7 is a flow chart of a prediction process of electric power supply executed by the regional energy management apparatus according to the embodiment of the present invention.

FIG. 7 is a flow chart of the prediction process of electric power supply executed by the regional energy management apparatus 200 according to the embodiment of the present invention.

The regional energy management apparatus 200 refers to a meteorological data performance 701 and a weather forecast 702 to perform estimation of the amount of sunshine (step 703) and predicts a solar power generation supply amount on the basis of a result of the estimation (step 704). This is a prediction of the supply amount of electric power by the solar power generation company 103, for example. Although the meteorological data performance 701 and the weather forecast 702 may be similar to the meteorological data performance 601 and the weather forecast 602 depicted in FIG. 6, preferably they include information relating to a region in which the solar power generation facility exists. In step 704, information relating to the region in which the solar power generation facility exists is estimated.

Further, the regional energy management apparatus 200 performs estimation of wind power on the basis of the estimated amount of sunshine and a terrain condition 705 (step 706) and predicts a wind-power generation supply amount on the basis of a result of the estimation (step 707). This is a prediction of the supply amount of electric power by the wind-power generation company 104, for example. The terrain condition 705 preferably includes information relating to the region in which the wind power generation facility exists or information relating to the terrain of the region that may influence on the air flow in the wind power generation facility.

For example, when the electric power demand for the period after the present point of time till 36 hours later or 48 hours later in the process of FIG. 6, it is preferable in the process of FIG. 7, similarly, that the electric power demand for the period after the present point of time till 36 hours later or 48 hours later is predicted.

Figure 8:
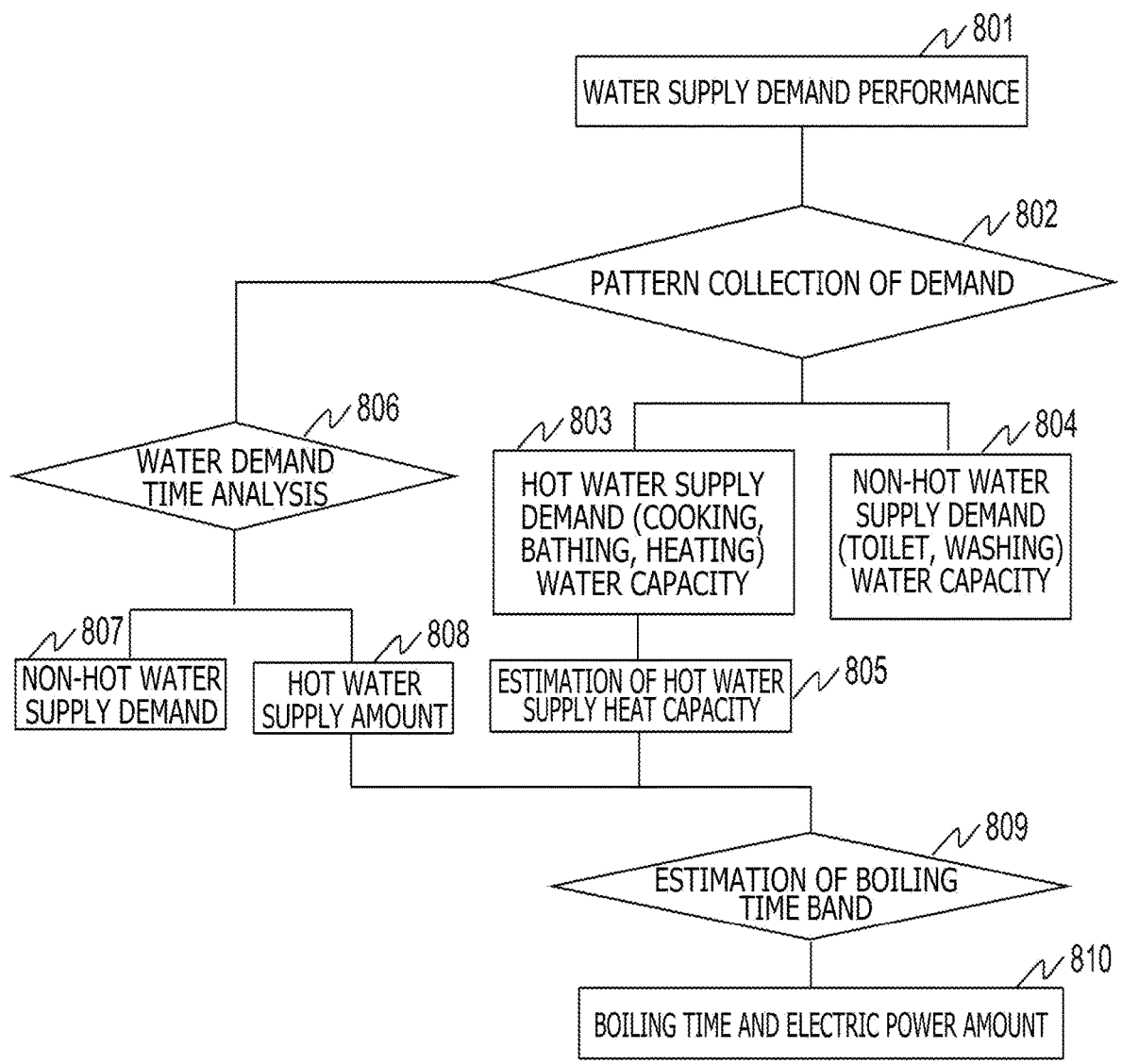
FIG. 8 is a flow chart of a hot water supply boiling time determination process executed by the regional energy management apparatus according to the embodiment of the present invention.

FIG. 8 is a flow chart of the hot water supply boiling time determination process executed by the regional energy management apparatus 200 according to the embodiment of the present invention.

First, the regional energy management apparatus 200 refers to a water supply demand performance 801 to perform demand pattern collation (step 802) and estimates the water capacity of the hot water supply demand and the water capacity of the non-hot water supply demand on the basis of a result of the collation (steps 803 and 804). The hot water supply demand is a water demand that involves hot water boiling for cooking, basing, warming, and so forth, and the non-hot water supply demand is a water demand that does not involve hot water boiling for a flush toilet, or the like.

The regional energy management apparatus 200 estimates the heat capacity of hot water supply on the basis of a result of the estimation of the water capacity of the hot water supply demand (step 805). Further, the regional energy management apparatus 200 performs analysis of time at which the water demand occurs on the basis of a result of the pattern collation in step 802 (step 806), and estimates the time at which non-hot water supply demand occurs and the time at which hot water supply demand occurs (steps 807 and 808).

Then, the regional energy management apparatus 200 estimates the boiling time zone (namely, a time zone suitable to perform boiling for hot water supply) on the basis of a result of the estimation of the heat capacity of hot water supply (step 805) and a result of the estimation of the time at which the hot water supply demand occurs (step 808) (step 809), and then determines, on the basis of a result of the estimation, the boiling time (namely, the time at which boiling for hot water supply is started) and the electric power amount consumed by the boiling (step 810).

The water demand by the toilet does not require hot water supply and besides the amount of consumption of water per one time is determined, for example. Therefore, the regional energy management apparatus 200 may first decide the water demand by the toilet and distinguish this water demand from the water demand that does not relate to the electric power demand. Although the remaining demand is the hot water supply demand, since the most part of the remaining demand is occupied by the demand for hot water supply to the bathtub necessary for bathing, the time zone within which the demand occurs is analyzed. Since, generally, the hot water supply demand for bathing occurs at night, also it is possible to adjust the electric power demand by boiling the hot water for bathing in the daytime in advance.

Further, since the hot water supply demand for bathing can be distinguished readily from the other hot water supply demand (for example, for cooking) because it indicates a large amount of consumption in a short period of time. On the basis of the fact, the hot water supply demands may be classified into a demand for bathing and the other demands for decision. Generally, the hot water supply demand for cooking is approximately ten percent of the hot water supply demand for bathing.

For example, in the case of the hot water supply demand from each home 106 or the building 107, if equipment for storing the boiled hot water with the hot water kept warm is available, the electric power demand for boiling can be shifted forwardly (namely, in the direction of early time) by storing the hot water that is boiled before a hot water supply demand actually occurs. When the electric power supply becomes over-demand and thereafter it is predicted that the electric power supply becomes insufficient for the electric power demand, for example, balancing between the demand and the supply can be achieved by shifting the electric power demand forwardly as described above. The regional energy management apparatus 200 may notify each home 106 or the building 107 of the boiling time determined in this manner, or alternatively, the boiling may be started at the time by such a method as to transmit an instruction to start boiling at the time.

Figure 9:
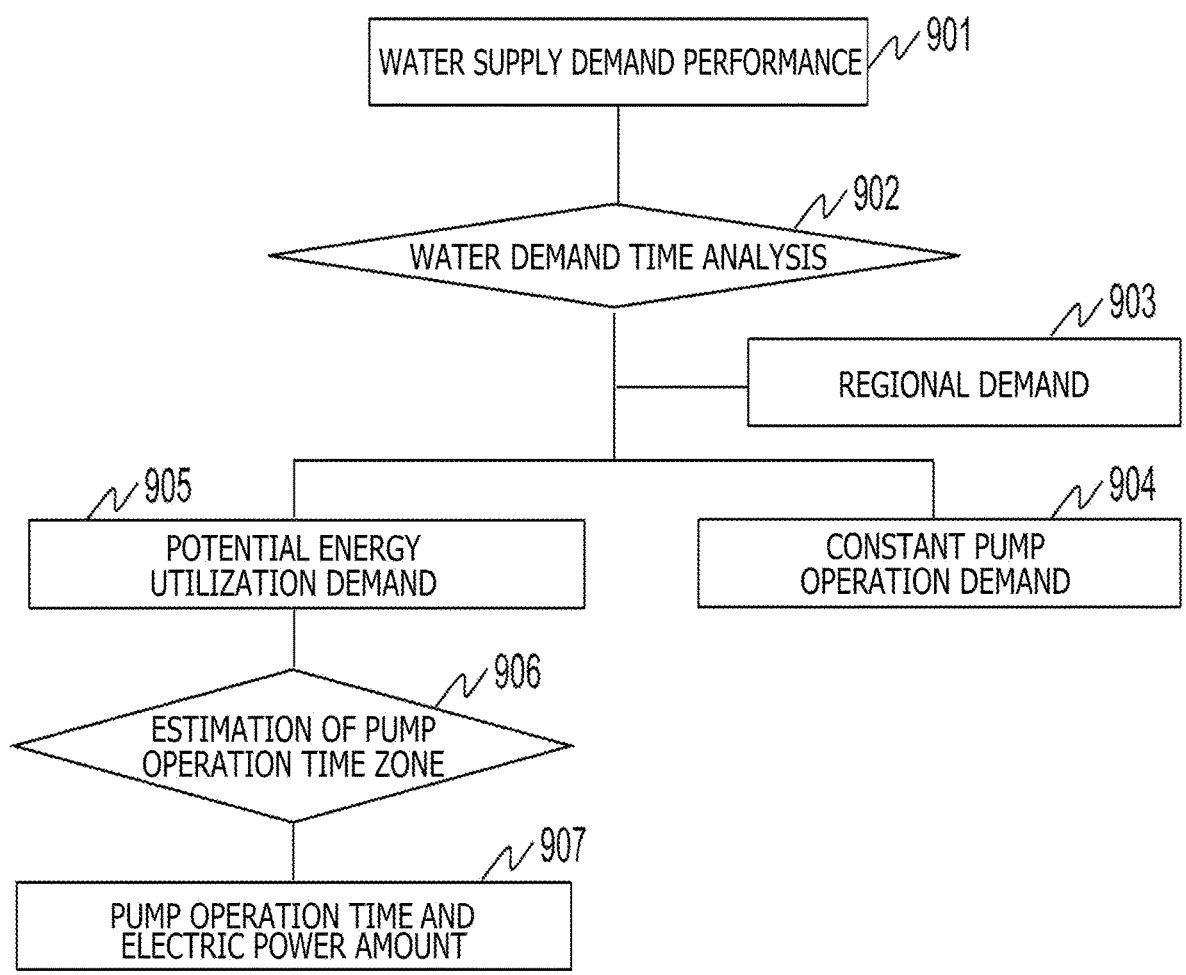
FIG. 9 is a flow chart of a water supply equipment pump operation time determination process executed by the regional energy management apparatus according to the embodiment of the present invention.

FIG. 9 is a flow chart of a water supply equipment pump operation time determination process executed by the regional energy management apparatus 200 according to the embodiment of the present invention.

First, the regional energy management apparatus 200 refers to a water supply demand performance 901 to analyze time at which water demand occurs (step 902). This process may be performed similarly to the process of performing pattern collation of the demands on the basis of the water supply demand performance 801 (step 802) and performing water demand time analysis (step 806) as depicted in FIG. 8.

The regional energy management apparatus 200 performs estimation of the normal pump operation demand (step 904) and estimation of the potential energy utilization demand (step 905) on the basis of a result of the water demand time analysis and a regional demand 903. Here, the regional demand 903 includes information about the demand relating to an equipment operation system such as an operation status of a large scale consumer including a factory and so forth and an operation of a pumping station on a hill.

Further, the regional energy management apparatus 200 estimates the pump operation time zone on the basis of a result of the estimation of the potential energy utilization demand (step 906) and determines pump operation time and an electric power amount consumed by the pump operation (step 907).

Here, the normal pump operation demand is a demand for pump operation for securing a water pressure on a flag ground, for example, and does not become a target of electric power adjustment because stopping of the pump disables stable water supply. On the other hand, the potential energy utilization demand is a demand for pump operation for storing water into a tank installed on a hill, for example, and becomes a target of electric power adjustment because the potential energy can be utilized to supply water while the stored water remains even if the pump stops. For example, by causing the pump to operate for storing water before a water demand occurs, the electric power demand for operating the pump can be shifted forwardly (namely, in the direction of early time). For example, when the electric power supply first becomes excessive for the electric power demand and then it is predicted that the electric power supply becomes insufficient for the electric power demand later, balancing between the supply and the demand can be achieved by shifting the electric power demand forwardly as described above. The regional energy management apparatus 200 may notify the water supply company 108 of the pump operation time determined in this manner, or alternatively, the regional energy management apparatus 200 may cause operation of the pump to be started at the time by such a method as to transmit an instruction to start the pump operation at the time.

As described hereinabove, in order to allow cooperation between VRE and the electric power demand in a region, it is required to cope with both the scale and the time of electric power. According to the present embodiment, by utilizing energy involved in water supply infrastructures and hot water supply for consumers in a region, cooperation with variable renewable energy in the region can be achieved.

Further, according to the present embodiment, it is possible to utilize data of the water supply smart meters of consumers to grasp the demand status of water supply and to control operation of a large scale water supply facility such as a water purification plant or a water distribution pump through cooperation between the data and a supply prediction of VRE.

Further, according to the present embodiment, it is possible to utilize data of the water supply smart meters of the consumers to predict the demand from the consumers according to hot water supply, and it is possible to perform time operation for absorbing surplus electric power through cooperation between the energy demand prediction of the hot water supply and the time zone during which the VRE is in surplus in the daytime.

Specifically, according to one mode of the present invention, by utilizing the electric power fluctuation of VRE in a region and the smart meter of water supply for grasping electric power demand in the region, implementation of cooperative operation with the water supply equipment in which the demand of the overall water supply is grasped, and energy storage as hot water supply energy by the consumers, in which electric power can be absorbed when VRE is in surplus, are enabled. Thus, implementation of stable supply by the regional electric power company whose responsibilities are stable supply of electric power, and utilization of less expensive electric power by the water supply business operating company are enabled, and further, energy storage as hot water supply energy is enabled by general consumers acquiring less expensive electric power when the electric power is in surplus.

Representative examples of the present embodiment are described below.

(1) In an energy management system (for example, the regional energy management apparatus 200 or the regional energy management system 100 including the regional energy management apparatus 200) including a processor (for example, the processor 301) and a storage device (for example, at least one of the memory 302 and the storage device 303), the processor predicts an electric power supply amount utilizing renewable energy in a predetermined region (for example, step 502), predicts an electric power demand amount in the region (for example, step 501), predicts a demand amount in the region of an infrastructure service different from an electric power service (for example, step 803, step 904, or step 905), predicts an electric power demand amount corresponding to the infrastructure service on the basis of the predicted demand amount in the region of the infrastructure service (for example, step 803, step 904 or step 905), and determines use time of electric power corresponding to the infrastructure service such that the electric power demand amount in the region approaches the electric power supply amount (for example, step 810 or step 907).

This makes it possible to implement cooperation in the demand and supply balance of variable renewable energy in the region by operation of infrastructures of the infrastructure service.

(2) In (1) above, the infrastructure service is a water supply service; the demand amount of the infrastructure service in the region is a water supply demand amount in the region; the electric power demand amount corresponding to the infrastructure service is an electric power demand amount for operation of a distribution pump for the water supply service; and the processor changes time at which the electric power demand for water distribution utilizing potential energy from among the electric power demand for operation of the water distribution pump in a direction earlier than time at which demand of the infrastructure service in the region occurs to determine use time of electric power corresponding to the infrastructure service such that the electric power demand amount in the region approaches the electric power supply amount, and outputs information indicating that the water distribution pump is operated at the determined use time to a water supply company by which the water supply service is provided.

This makes it possible to implement cooperation in the demand and supply balance of variable renewable energy in the region by operation of the equipment of the water company.

(3) In (1) above, the infrastructure service is a water supply service; the demand amount of the infrastructure service in the region is a hot water supply demand amount in the region; the electric power demand amount corresponding to the infrastructure service is an electric power demand amount for hot water boiling; and the processor changes the time at which electric power demand for hot water boiling occurs in a direction earlier than the time at which hot water supply demand in the region occurs to determine the use time of electric power corresponding to the infrastructure service such that the electric power demand amount in the region approaches the electric power supply amount and outputs information indicating that hot water boiling is performed at the determined use time to a consumer of the electric power that performs hot water boiling.

This makes it possible to implement coordination in supply and demand balance of variable renewable energy in the region by operation of hot water boiling by consumers that utilize the water supply and the electric power.

(4) In (3) above, the storage device retains meteorological performance information of the region in the past (for example, the meteorological data 217), meteorological forecast information of the region in the future (for example, the meteorological data 217) and operation schedule information of facilities in the region (for example, the facility operation calendar 218), and the processor predicts the hot water supply demand amount in the region on the basis of the meteorological performance information, the meteorological forecast information and the operation schedule information of the facilities.

This makes it possible to appropriately predict the electric power demand for hot water supply in the region.

(5) In (1) above, the infrastructure service is a water supply service; the demand amount of the infrastructure service in the region is a water supply demand amount in the region; and the processor predicts a water supply demand amount in the region on the basis of information from water supply smart meters of consumers of the water supply service.

This makes it possible to appropriately predict the water supply demand in the region.

(6) In (1) above, the storage device retains performance information of the electric power demand in the region in the past (for example, the electric power demand performance 603), meteorological performance information in the region in the past (for example, the meteorological data performance 601), meteorological forecast information in the region in the future (for example, the weather forecast 602), and operation schedule information of facilities in the region (for example, the operation calendar 604), and the processor predicts the electric power demand amount in the region on the basis of the performance information of the electric power demand, the meteorological performance information, the meteorological forecast information and the operation schedule information of the facilities.

This makes it possible to appropriately predict the electric power demand in the region.

(7) In (1) above, the storage device retains meteorological performance information in the region in the past (for example, the meteorological data performance 701), meteorological forecast information in the region in the future (for example, the weather forecast 702), and terrain information relating to the region (for example, the terrain condition 705); the electric power supply amount utilizing renewable energy is at least either the electric power supply amount by solar power generation or the electric power supply amount by wind-power generation; and the processor predicts the electric power supply amount by solar power generation on the basis of the performance information of the electric power demand in the region in the past, the meteorological performance information in the region in the past, and the meteorological forecast information in the region in the future (for example, step 704) and predicts the electric power supply amount by wind-power generation on the basis of the meteorological performance information in the region in the past, the meteorological forecast information in the region in the future, and the terrain information relating to the region (for example, step 707).

This makes it possible to appropriately predict the electric power supply by renewable energy.

It is noted that the present invention is not limited to the embodiment described above and includes various modifications. For example, the above-described embodiment is described in detail for better understandings of the present invention and is not necessarily restricted to an embodiment that includes all configurations described hereinabove. Further, it is possible to replace part of components of a certain embodiment with a component of a different embodiment. Further, it is possible to add a component of an embodiment to components of a different embodiment. Further, it is possible to perform addition, deletion, or replacement of a component to, from, or with part of components of each embodiment.

Further, the components, functions, processing units, processing means, and so forth described above may be represented by hardware by designing part or the entirety of them with integrated circuits or the like. Further, the components, functions, and so forth described above may be implemented by software such that a processor interprets and executes programs for implementing the individual functions. Information on programs, tables, files and so forth for implementing the functions can be stored into a storage device such as a nonvolatile semiconductor memory, a hard disk drive, a solid state drive (SSD), or the like, or a computer-readable non-transitory data storage medium such as an integrated circuit (IC) card, a secure digital (SD) card, a digital versatile disc (DVD), or the like.

Further, as regards control lines and information lines, only those that are considered necessary for description are indicated, and all of control lines and information lines necessary for a product are not necessarily be indicated. It may be considered that almost all components are actually connected to each other.

What is claimed is:

1. An energy management system comprising:
   a processor; and
   a storage device,
   the processor
      predicting an electric power supply amount utilizing renewable energy in a predetermined region;
      predicting an electric power demand amount in the region;
      predicting a demand amount of a water supply service in the region;
      predicting a demand amount of a hot water supply in the region;
      predicting an electric power demand amount corresponding to the water supply service on a basis of the predicted demand amount of the water supply service in the region and the predicted demand amount of the hot water supply in the region;
      predicting a first demand time of the hot water supply in the region;
      predicting a second demand time of the water supply service in the region; and
      determining a first set time or a second set time, wherein the first adjustment set time comprises determining a boiling time of the hot water supply on a basis of the predicted demand time of the hot water supply in the region and the predicted electric power demand amount corresponding to the water supply service, and wherein the second set time comprises determining a water supply equipment pump operation time on a basis of the predicted demand time of the water supply service in the region and the predicted electric power demand amount corresponding to the water supply service; and controlling the energy management system based on the first set time and the second set time.

2. The energy management system according to claim 1, wherein
   the electric power demand amount corresponding to the water supply service is an electric power demand amount for operation of a distribution pump for the water supply service;
   the predicted electric power supply amount is earlier than the predicted electric power demand amount corresponding to the water supply service; and
   the processor is configured to
      match the electric power demand amount with the electric power supply amount by setting the second set time, at which electric power demand for water distribution occurs, to a time earlier than the predicted second demand time, at which demand of the water supply service in the region occurs, and
      output information indicating that the water distribution pump is operated at the second set time to a water supply company by which the water supply service is provided.

3. The energy management system according to claim 1, wherein
   the electric power demand amount corresponding to the water supply service is an electric power demand amount for hot water boiling;
   the predicted electric power supply amount is earlier than the predicted electric power demand amount corresponding to the hot water boiling; and
   the processor is configured to
      match the electric power demand amount in the region with the electric power supply amount by setting the first set time, at which electric power demand for the hot water boiling occurs, to a time earlier than the predicted first demand time, at which hot water supply boiling service demand in the region occurs; and
      outputs information indicating that hot water boiling is performed at the determined first set time to a consumer of the electric power that performs hot water boiling.

4. The energy management system according to claim 3, wherein
   the storage device retains meteorological performance information of the region in a past, meteorological forecast information of the region in future and operation schedule information of facilities in the region, and
   the processor predicts the hot water supply demand amount in the region on a basis of the meteorological performance information, the meteorological forecast information, and the operation schedule information of the facilities.

5. The energy management system according to claim 1, wherein
   the processor predicts the water supply demand amount in the region on a basis of information from water supply smart meters of consumers of the water supply service.

6. The energy management system according to claim 1, wherein
   the storage device retains performance information of electric power demand in the region in a past, meteorological performance information in the region in the past, meteorological forecast information in the region in future, and operation schedule information of facilities in the region, and
   the processor predicts the electric power demand amount in the region on a basis of the performance information of the electric power demand, the meteorological performance information, the meteorological forecast information, and the operation schedule information of the facilities.

7. The energy management system according to claim 1, wherein
   the storage device retains performance information of the electric power demand in the region in a past, meteorological performance information in the region in the past, meteorological forecast information in the region in future and terrain information relating to the region,
   the electric power supply amount utilizing renewable energy is at least either the electric power supply amount by solar power generation or the electric power supply amount by wind-power generation, and
   the processor
      predicts the electric power supply amount by solar power generation on a basis of the meteorological performance information in the region in the past and the meteorological forecast information in the region in the future, and
      predicts the electric power supply amount by wind-power generation on a basis of the meteorological performance information in the region in the past, the meteorological forecast information in the region in the future and the terrain information relating to the region.

8. An energy management method executed by an energy management system that includes a processor and a storage device, the energy management method comprising:
   a first procedure, by the processor, of predicting an electric power supply amount utilizing renewable energy in a predetermined region;
   a second procedure, by the processer, of predicting an electric power demand amount in the region;
   a third procedure, by the processor, of predicting a demand amount of a water supply service in the region;
   a fourth procedure, by the processor, of predicting a demand amount of a hot water supply in the region;
   a fifth procedure, by the processor, of predicting an electric power demand amount corresponding to the water supply service on a basis of the predicted demand amount of the water supply service in the region and the predicted demand amount of the hot water supply in the region;
   a sixth procedure, by the processor, of predicting a first demand time of the hot water supply in the region;
   a seventh procedure, by the processor, of predicting a second demand time of the water supply service in the region; and
   an eighth procedure, by the processor, determining to set a first set time or a second set time, wherein the first set time comprises determining a boiling time of the hot water supply on a basis of the predicted demand time of the hot water supply in the region and the predicted electric power demand amount corresponding to the water supply service, and wherein the second set time comprises determining a water supply equipment pump operation time on a basis of the predicted demand time of the water supply service in the region and the predicted electric power demand amount corresponding to the water supply service; and a ninth procedure, by the processor, controlling the energy management system based on the first set time and the second set time.

9. The energy management method according to claim 8, wherein
   the electric power demand amount corresponding to the water supply service is an electric power demand amount for operation of a distribution pump for the water supply service;
   the predicted electric power supply amount is earlier than the predicted electric power demand amount corresponding to the water supply service; and
   in the eighth procedure, the processor is configured to
      match the electric power demand amount with the electric power supply amount by setting the second set time, at which electric power demand for water distribution occurs, to a time earlier than the predicted second demand time, at which demand of the water supply service in the region occurs; and
      output information indicating that the water distribution pump is operated at the second set time to a water supply company by which the water supply service is provided.

10. The energy management method according to claim 8, wherein
    the electric power demand amount corresponding to the water supply service is an electric power demand amount for hot water boiling;
    the predicted electric power supply amount is earlier than the predicted electric power demand amount corresponding to the hot water boiling; and
    in the eighth procedure, the processor is configured to
       match the electric power demand amount in the region with the electric power supply amount by setting the first set time, at which electric power demand for the hot water boiling occurs, to a time earlier than the predicted first demand time, at which hot water supply demand in the region occurs; and
    outputs information indicating that hot water boiling is performed at the determined first set time to a consumer of the electric power that performs hot water boiling.

11. The energy management method according to claim 10, wherein
    the storage device retains meteorological performance information of the region in a past, meteorological forecast information of the region in future and operation schedule information of facilities in the region, and
    in the third procedure, the processor predicts the hot water supply demand amount in the region on a basis of the meteorological performance information, the meteorological forecast information, and the operation schedule information of the facilities.

12. The energy management method according to claim 8, wherein
    in the third procedure, the processor predicts a water supply demand amount in the region on a basis of information from water supply smart meters of consumers of the water supply service.

13. The energy management method according to claim 8, wherein
    the storage device retains performance information of the electric power demand in the region in a past, meteorological performance information in the region in the past, meteorological forecast information in the region in future, and operation schedule information of facilities in the region, and
    in the second procedure, the processor predicts the electric power demand amount in the region on a basis of the performance information of the electric power demand, the meteorological performance information, the meteorological forecast information, and the operation schedule information of the facilities.

14. The energy management method according to claim 8, wherein
    the storage device retains performance information of the electric power demand in the region in a past, meteorological performance information in the region in the past, meteorological forecast information in the region in future, and terrain information relating to the region,
    the electric power supply amount utilizing renewable energy is at least either the electric power supply amount by solar power generation or the electric power supply amount by wind-power generation, and
    in the first procedure, the processor
       predicts the electric power supply amount by solar power generation on a basis of the meteorological performance information in the region in the past and the meteorological forecast information in the region in the future, and
       predicts the electric power supply amount by wind-power generation on a basis of the meteorological performance information in the region in the past, the meteorological forecast information in the region in the future, and the terrain information relating to the region.

* * * * *